US011125786B2

(12) United States Patent
Bergmann et al.

(10) Patent No.: US 11,125,786 B2
(45) Date of Patent: Sep. 21, 2021

(54) METHOD FOR DETECTING AN INTERNAL SHORT CIRCUIT IN A FIRST ELECTRICAL ENERGY STORAGE UNIT OF AN ELECTRICAL ENERGY STORAGE DEVICE

(71) Applicant: Robert Bosch GmbH, Stuttgart (DE)

(72) Inventors: Sven Bergmann, Brackenheim (DE); Chrysanthos Tzivanopoulos, Remseck am Neckar (DE); Johannes Swoboda, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 267 days.

(21) Appl. No.: 16/242,161

(22) Filed: Jan. 8, 2019

(65) Prior Publication Data

US 2019/0214689 A1 Jul. 11, 2019

(30) Foreign Application Priority Data

Jan. 8, 2018 (DE) ..................... 10 2018 200 145.6

(51) Int. Cl.
| | | |
|---|---|---|
| *G01R 19/165* | (2006.01) | |
| *G01R 31/389* | (2019.01) | |
| *H01M 10/42* | (2006.01) | |
| *H01M 10/48* | (2006.01) | |
| *G01R 31/52* | (2020.01) | |

(52) U.S. Cl.
CPC ..... *G01R 19/16542* (2013.01); *G01R 31/389* (2019.01); *H01M 10/425* (2013.01); *H01M 10/482* (2013.01); *G01R 31/52* (2020.01); *H01M 2010/4271* (2013.01); *H01M 2220/20* (2013.01)

(58) Field of Classification Search
CPC .... H01M 10/48; H01M 10/482; H01M 10/42; H01M 10/425; G01R 19/16542; G01R 31/389
See application file for complete search history.

(56) References Cited

U.S. PATENT DOCUMENTS

| | | |
|---|---|---|
| 9,673,738 B2 | 6/2017 | Miller et al. |
| 2012/0182021 A1 | 7/2012 | McCoy et al. |
| 2013/0113495 A1 | 5/2013 | Kim et al. |
| 2013/0140886 A1* | 6/2013 | Bito .......................... B60L 1/02 307/10.7 |

FOREIGN PATENT DOCUMENTS

| | | |
|---|---|---|
| DE | 112011101823 | 3/2013 |
| DE | 102015110183 A1 | 12/2016 |
| WO | 2011003251 | 1/2011 |

* cited by examiner

*Primary Examiner* — Karie O'Neill Apicella
(74) *Attorney, Agent, or Firm* — Michael Best & Friedrich LLP

(57) ABSTRACT

A method for detecting an internal short circuit in a first electrical energy storage unit of an electrical energy storage device is described, wherein the electrical energy storage device comprises at least two electrical energy storage units including a first electrical energy storage unit and a second electrical energy storage unit electrically connected in parallel in the electrical energy storage device, the method including recording an electric current flowing into or out of the first electrical energy storage unit, recording an electric current flowing into or out of the second electrical energy storage unit, determining a short-circuit current in the first electrical energy storage unit based on the at least two recorded electric currents, and detecting an internal short circuit when the magnitude of the short-circuit current exceeding a predefined short-circuit current threshold.

13 Claims, 3 Drawing Sheets

METHOD FOR DETECTING AN INTERNAL SHORT CIRCUIT IN A FIRST ELECTRICAL ENERGY STORAGE UNIT OF AN ELECTRICAL ENERGY STORAGE DEVICE

BACKGROUND OF THE INVENTION

The present invention is based on a method for detecting an internal short circuit in a first electrical energy storage unit of an electrical energy storage device, wherein the electrical energy storage device comprises at least two electrical energy storage units, a first electrical energy storage unit and a second electrical energy storage unit, which are electrically connected in parallel in the electrical energy storage device.

In the course of the increasing electrification of vehicles, in particular motor vehicles, large electrical energy storage devices that consist of a plurality of smaller units are increasingly being used. These are usually in the form of battery packs, which are formed of a plurality of battery modules or battery cells. To ensure the safety of these energy storage devices, parameters such as an electric current and an electrical voltage of the electrical energy storage device or its smaller constituent units are usually monitored. If these parameters exceed or fall below certain thresholds or limits, this usually means a risk to the safety of the electrical energy storage device. Therefore, when this occurs, for example, so-called contactors are opened, in order to prevent a current flow into the electrical energy storage device. In less critical cases, for example, a maximum current value is reduced.

The smaller units are usually connected to each other in a serial configuration. In the case of units connected in parallel, the same electrical voltage exists between the units due to the parallel connection. Detection of an internal short circuit, for example, in parallel-connected battery cells by means of a voltage measurement and a resulting voltage decrease is therefore not a simple matter.

The document DE 11 2011 101 823 T5 describes a control system for a parallel battery connection circuit, which detects abnormalities by determining and comparing conditions of a plurality of secondary battery packs.

In WO 2011/003251 A1 a battery management system is described, which comprises a battery system with serial and parallel interconnection, in which measuring points are connected to the battery management system via a resistor to enable the detection of faults in the battery system.

SUMMARY OF THE INVENTION

A method is disclosed for detecting an internal short circuit in a first electrical energy storage unit of an electrical energy storage device, wherein the electrical energy storage device comprises at least two electrical energy storage units, a first electrical energy storage unit and a second electrical energy storage unit, which are electrically connected in parallel in the electrical energy storage device.

In the method, the electric current flowing into or out of the first electrical energy storage unit is recorded, for example with a Hall-effect current sensor or a shunt current sensor. In addition, the electrical current flowing into or out of the second electrical energy storage unit is recorded. Depending on these recorded currents, a short-circuit current in the first electrical energy storage unit is determined. This can be carried out, for example, based on internal resistance values of the parallel-connected electrical energy storage units and by summing the changes in the recorded electric currents. Corresponding calculation rules are given below. In the case of a short circuit within the first electrical energy storage unit, this short-circuit current is caused by the fact that the short circuit acts like a parallel electrical resistance in the first electrical energy storage unit. This causes a decrease in the externally visible internal resistance of the first electrical energy storage unit. In addition, the open circuit voltage curve changes indirectly due to an increased discharge of the first electrical energy storage unit. If the magnitude of the short-circuit current exceeds a predefined short-circuit current threshold, this is detected as the presence of an internal short circuit in the first electrical energy storage unit. The method therefore advantageously allows the detection of a short circuit and therefore helps to prevent dangerous situations that can result from an internal short-circuit from occurring, for example an uncontrolled discharge of the first electrical energy storage unit and a controlled heating associated therewith.

Advantageously, the current flow into the first electrical energy storage unit is then controlled in such a way that the magnitude of a corresponding current value no longer exceeds a predefined emergency current value. Alternatively, the flow of current into the first electrical energy storage unit can also be completely disconnected. This can be achieved, for example, by providing appropriate power electronic components, for example using power transistors, or mechanical components such as contactors, in the electrical energy storage device.

Conveniently, from the recorded currents flowing into or out of the at least two electrical energy storage units, corresponding differential current values are determined. This means that corresponding first difference current values are determined from the recorded current values of the first electrical energy storage unit by difference formation and corresponding second differential current values are determined from the recorded current values of the second electrical energy storage unit. The short-circuit current is then determined or calculated from the differential current values. This can be carried out, for example, with the formula (1) given below, in which corresponding difference values are calculated from discrete power values and the factor $k_3$ is determined in an appropriate manner. Corresponding methods are given below. This has the advantage that, due to the use of differences, no absolute values of the respective current are entered into the calculation or determination. The method is therefore relatively insensitive to an offset current in the current measurement by means of a current sensor.

Conveniently, an internal resistance ratio of the at least two electrical energy storage units is determined. This can be carried out, for example, by the specific determination of the internal resistance values of the at least two electrical energy storage units or by using the ratio of a sum of quotients, which express the first differential current value of the first electrical energy storage unit as a proportion of a differential total current value formed from a total current value. In this case, the internal resistance ratio can represent the ratio of an internal resistance value of the first electrical energy storage unit to the sum of the internal resistance values of the first and second electrical energy storage unit. The short-circuit current is then determined as a function of the determined internal resistance ratio, for which, for example, the formula (1) can be used, in which the factor $k_3$ represents the corresponding internal resistance ratio. The above-mentioned differential current values can additionally be used. This increases the reliability and robustness of the procedure in an advantageous way by taking into account the internal resistance ratio of the electrical energy storage units.

Conveniently, the internal resistances of the at least two electrical energy storage units are determined. From the determined internal resistance values the short-circuit current is then determined, for example using the above-described internal resistance ratio. This allows a very precise determination of the short-circuit current, because the corresponding internal resistance values can be determined reliably and accurately.

Conveniently, the internal resistance ratio is determined using at least the first differential current values. It is also possible to use only a portion of the determined differential current values. Thus, advantageously no internal resistances of the corresponding energy storage units may need to be determined. The method therefore becomes less computationally intensive, for example, which extends its range of application.

Conveniently, the short-circuit current is determined by summation over a predefined number of differential current values. This can be carried out, for example, using the formulas (2), (3) and (4) given below, in which only differential current values are used. This has the advantage that, in contrast to an integration operation, possible offsets do not have too great an influence and do not distort the integral value very seriously. Also, in a technical system the differential current values are usually already present in a time-discrete form. Therefore, the calculation of the finite sum can advantageously be performed very easily.

A further subject of the disclosure is a device for detecting an internal short circuit in a first electrical energy storage unit of an electrical energy storage device, wherein the device comprises at least one means, in particular an electronic battery management controller, which is configured to carry out the disclosed method. Thus, the device directly implements the advantages described above.

The at least one means can comprise, for example, a battery management controller and a corresponding power electronics, for example an inverter, as well as current sensors and/or voltage sensors and/or temperature sensors. An electronic control unit, in particular in the form of a battery management controller, can also be such a means.

An electronic control unit can be understood to mean in particular an electronic control unit, which comprises, for example, a microcontroller and/or an application-specific hardware component, e.g. an ASIC, but it is also understood to include a personal computer or a programmable logic controller.

The subject matter of the disclosure also includes a computer program, which comprises commands to ensure that the above-mentioned device executes the disclosed method. Thus, in an advantageous manner, when the computer program is executed on a suitable technical device, such as a computer, the advantages of the method are realized.

The subject matter of the disclosure also includes a machine-readable storage medium, on which the disclosed computer program is stored. Thus, in an advantageous manner the dissemination and use of the described computer program are easily possible.

The subject matter of the disclosure also includes an electrical energy storage device, which comprises at least two electrical energy storage units and additionally comprises the disclosed device. This advantageous allows the described benefits of the method to be realized.

An electrical energy storage unit may be understood to mean, in particular, an electro-chemical battery cell and/or a battery module with at least one electrochemical battery cell and/or a battery pack with at least one battery module. For example, the electrical energy storage unit can be a lithium-based battery cell or a lithium-based battery module or a lithium-based battery pack. In particular, the electrical energy storage unit can be a lithium-ion battery cell or a lithium-ion battery module or a lithium-ion battery pack. Furthermore, the type of the battery cell can be lithium-polymer rechargeable accumulator, nickel-metal-hydride accumulator, lead-acid accumulator, lithium-air accumulator or lithium-sulfur battery accumulator, or quite generally, an accumulator of any electro-chemical composition. A capacitor is also possible as the electrical energy storage unit.

BRIEF DESCRIPTION OF THE DRAWINGS

Advantageous embodiments of the invention are shown in the Figures and described in more detail in the following description.

Shown are.

DETAILED DESCRIPTION

Figure 1:
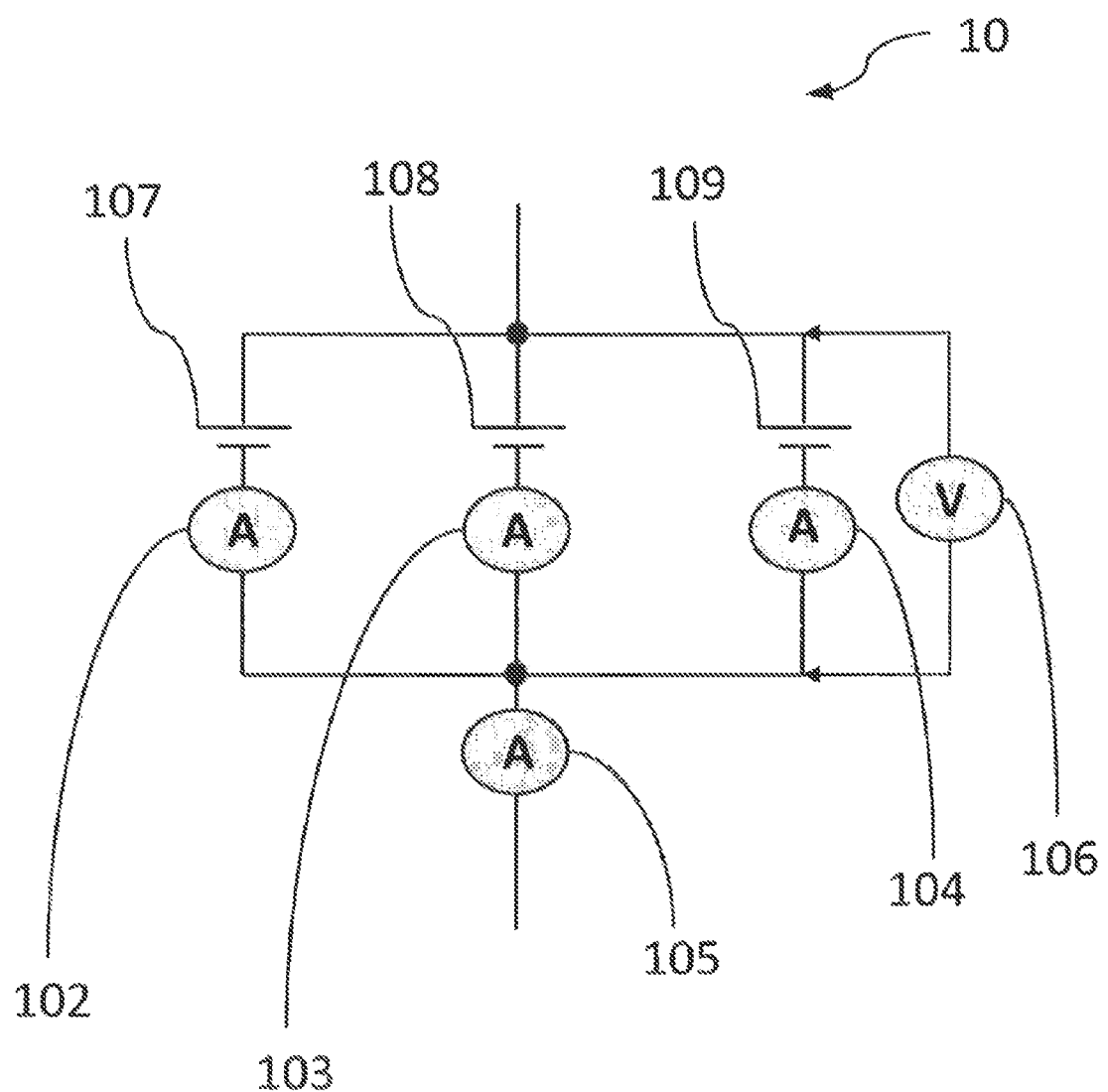
FIG. 1 a schematic representation of the disclosed electrical energy storage device in accordance with one embodiment.

The same reference numerals refer to the same device components or the same method steps in all figures.

FIG. 1 shows a schematic representation of the disclosed electrical energy storage device 10 with three electrical energy storage units 107, 108, 109, which are electrically connected to each other in parallel. Using current sensors 102, 103, 104, a current flowing into each corresponding electrical energy storage unit is recorded. The recorded current amplitudes are then forwarded to a battery management controller, not shown here. Similarly, by means of a current sensor 105 the total current, which consists of the individual strands, is recorded. This recorded current amplitude is also forwarded to the battery management controller, not shown here. Using a voltage sensor 106, an electrical voltage of the parallel connected electrical energy storage units is recorded. Due to the parallel connection, the recorded voltage is essentially identical for all the electrical energy storage units 107, 108, 109. The recorded voltage amplitude is likewise forwarded to the battery management controller, not shown here. The battery management controller executes the disclosed method for detecting an internal short circuit in one of the electrical energy storage units.

Figure 2:
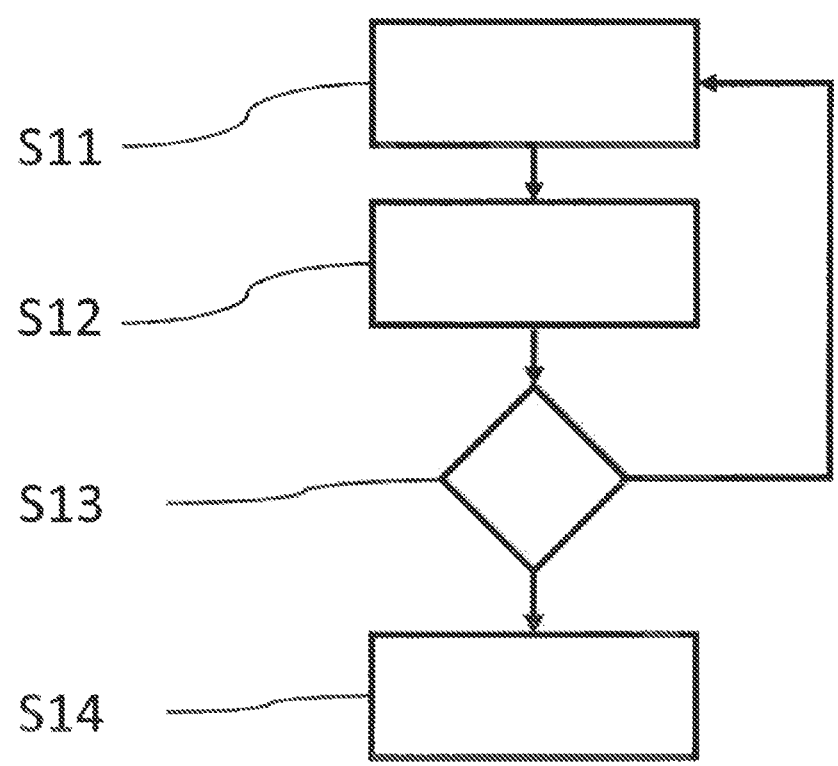
FIG. 2 a flow diagram of the disclosed method in accordance with a first embodiment.

FIG. 2 shows a flow diagram of the disclosed method in accordance with a first embodiment. In a first step S11 an electric current flowing into the first electrical energy storage unit 107 is recorded. In addition, in the first step S11 an electric current flowing into the second electrical energy storage unit 108 is recorded. In addition, in the first step S11 an electric current flowing into the third electrical energy storage unit 109 is recorded. A total current can also be recorded, which is then divided over the corresponding partial currents, as described above. The three electrical energy storage units are part of the electrical energy storage device 10 and are connected in parallel to each other.

The determination of the short-circuit current in a second step S12 is model-based, wherein the derivation of the fundamental relationships is described in detail below, and therefore also applies to later embodiments.

To this end, the simplifying assumption is made that a real electrical energy storage unit can be modeled as a series circuit of an equivalent voltage source and an ohmic resistance as the internal resistance. The individual currents of the first, second and third electrical energy storage units 107, 108, 109 can therefore be described as follows:

$$I_{cell1} = G_1 \cdot \frac{I_{pack} + U_{OCV2} \cdot G_2 + U_{OCV3} \cdot G_3 - U_{OCV1} \cdot (G_2 + G_3)}{G_1 + G_2 + G_3},$$

$$I_{cell2} = G_2 \cdot \frac{I_{pack} + U_{OCV1} \cdot G_1 + U_{OCV3} \cdot G_3 - U_{OCV2} \cdot (G_1 + G_3)}{G_1 + G_2 + G_3},$$

$$I_{cell3} = G_3 \cdot \frac{I_{pack} + U_{OCV1} \cdot G_1 + U_{OCV2} \cdot G_2 - U_{OCV3} \cdot (G_1 + G_2)}{G_1 + G_2 + G_3},$$

where $G_1$ to $G_3$ each stand for the conductance value, i.e. the reciprocal of the ohmic resistance, $I_{pack}$ denotes the total current and $U_{ocv}$ the voltage of the respective equivalent voltage source, also referred to as the open circuit voltage.

Due to an internal short circuit, for example in the third electrical energy storage unit 109, the voltage value of the equivalent voltage source changes, as does the ohmic resistance of the third electrical energy storage unit 109. As a result, the cell currents change as follows:

$$I_{cell1} = G_1 \cdot \frac{I_{pack} + U_{OCV2} \cdot G_2 + U'_{OCV3} \cdot G'_3 - U_{OCV1} \cdot (G_2 + G'_3)}{G_1 + G_2 + G'_3},$$

$$I_{cell2} = G_2 \cdot \frac{I_{pack} + U_{OCV1} \cdot G_1 + U'_{OCV3} \cdot G'_3 - U_{OCV2} \cdot (G_1 + G'_3)}{G_1 + G_2 + G'_3},$$

$$I_{cell3} = G'_3 \cdot \frac{I_{pack} + U_{OCV1} \cdot G_1 + U_{OCV2} \cdot G_2 - U'_{OCV3} \cdot (G_1 + G_2)}{G_1 + G_2 + G'_3},$$

wherein the values changed by the short circuit are marked with an apostrophe.

The change or the differential current $dI_{cell3}$ of $I_{cell3}$ depends on the change in the total current $I_{pack}$. In the event of a short circuit there is an additional dependency on the value of the corresponding internal resistance or conductance $G_3$ and the voltage of the corresponding equivalent voltage source $U_{ocv3}$:

$$dI_{cell3} = \frac{\partial I_{cell3}}{\partial I_{pack}} dI_{pack} + \frac{\partial I_{cell3}}{\partial G_3} \partial G_3 + \frac{\partial I_{cell3}}{\partial U_{OCV3}} dU_{OCV3},$$

$$dI_{cell3} = \frac{G_3}{G_1 + G_2 + G_3} dI_{pack} + \frac{G_1 + G_2}{G_1 + G_2 + G_3} \left( \frac{I_{cell3}}{G_3} dG_3 - G_3 \cdot dU_{OCV3} \right).$$

With $dG_3 = dG_{short}$ and $$dU_{ocv3} = U_{OCV3} \frac{-dG_{short}}{dG_{short} + G_3}$$

it follows for $dI_{cell3}$:

$$dI_{cell3} = \frac{G_3}{G_1 + G_2 + G_3} dI_{pack} +$$

-continued $$\frac{G_1 + G_2}{G_1 + G_2 + G_3} \left( \frac{dG_{short}}{G_3} I_{cell3} + U_{OCV3} \cdot dG_{short} \frac{G_3}{dG_{short} + G_3} \right),$$

where $U_{OCV3} \cdot dG_{short} = dI_{short}$ is true and it therefore follows that:

$$dI_{cell3} = \frac{G_3}{G_1 + G_2 + G_3} dI_{pack} +$$

$$\frac{G_1 + G_2}{G_1 + G_2 + G_3} \left( \frac{dG_{short}}{G_3} I_{cell3} + dI_{short} \frac{G_3}{dG_{short} + G_3} \right).$$

This equation can be simplified in two steps:

On the one hand $$\frac{dG_{short}}{G_3} = 0$$

is usually approximately true, which means this term can be ignored. Secondly $$\frac{G_3}{dG_{short} + G_3} = 1$$

is usually approximately true, which means this term can be neglected as a factor.

From this simplification it follows:

$$dI_{cell3} = k_3 \cdot dI_{poack} + (1 - k_3) \cdot dI_{short} \text{ with } k_3 = \frac{G_3}{G_1 + G_2 + G_3}.$$

Solving for $dI_{short}$ gives:

$$dI_{short} = \frac{dI_{cell3} - k_3 \cdot dI_{pack}}{1 - k_3}.$$

By integrating this equation, the short-circuit current which flows in the third electrical energy storage unit can be determined. The result is:

$$I_{short} = \frac{1}{1 - k_3} \int (dI_{cell3} - k_3 \cdot dI_{pack}) dt.$$

In time-discrete form it reads as follows:

$$I_{short} = \frac{1}{1 - k_3} \sum (dI_{cell3} - k_3 \cdot dI_{pack}). \quad (1)$$

A windowing with the window width g, i.e. taking into account g sum terms, can prove useful in practice in order to prevent the integral drifting away, where n is the total number of previously recorded sum terms:

$$I_{short} = \frac{1}{1-k_3} \sum_{t=n-g}^{n} (dI_{cell3}(t) - k_3 \cdot dI_{pack}(t)), \text{ with } n \geq g, \quad (2)$$

$$dI_{pack} = \sum_{x=1}^{n_{cell}} dI_{cellx}, \quad (3)$$

$$k_3 = \frac{G_3}{G_1 + G_2 + G_3}.$$

In this case, the change in the total current $dI_{pack}$ can be determined using a summation over the changes in the currents $dI_{cell1}$, $dI_{cell2}$, $dI_{cell3}$ flowing in the individual electrical energy storage units, taking here $n_{cell}=3$.

Since the internal resistances of the electrical energy storage units 107, 108, 109 change over time during usage and therefore the corresponding electrical conductances G also change, it makes sense to adapt the factor $k_3$. Since the individual currents into the corresponding electrical energy storage units 107, 108, 109 are substantially proportional to the internal resistance of the electrical energy storage units, from the ratio of a corresponding individual current to the total current it is possible to determine the factor $k_3$. An averaging over a number h of a total of f values, where f>=h, is a sensible measure to mitigate adverse influences such as noise and measurement inaccuracies. From this the following is obtained, for example:

$$k_3 = \frac{G_3}{G_1 + G_2 + G_3} \cong \frac{1}{h} \sum_{t=f-h}^{f} \frac{dI_{cell3}(t)}{dI_{pack}(t)}. \quad (4)$$

In the second step S12, using the electric currents recorded in the first step S11 and by applying the formula (1), an electrical short-circuit current, which results from an internal short-circuit in the third electrical energy storage unit 109, is determined. In doing so, the factor $k_3$ used in the formula (1) can be determined, for example, by determination of the internal resistance values or the conductances G. To do this, current and voltage values of the electrical energy storage units 107, 108, 109 can be used, for example by simply calculating quotients. The factor $k_3$ is then obtained as indicated. The differential current $dI_{cell3}$ is calculated in discrete form by difference formation from recorded, discrete values of the cell current flowing into the third electrical energy storage unit 109. The same applies to the differential total current $dI_{pack}$.

The short-circuit current is therefore determined and can be used to detect an internal short circuit. To this end the magnitude(s) of the calculated short-circuit current or its discrete values is/are compared with a predefined short-circuit current threshold value in a third step S13. If the calculated short-circuit current is less than the short-circuit current threshold, it is assumed that there is no short circuit present, and the process continues with the first step S11. If the magnitude of the calculated short-circuit current is greater than the predefined short-circuit current threshold, then in a fourth step S14 an internal short-circuit is detected in the third electrical energy storage unit 109. Thereafter an electrical battery management controller can execute different steps. For example, if the value is only slightly exceeded, a maximum permissible total current or a permissible average total current can be reduced in order to allow at least a reduced driving operation, for example in order to locate a workshop. Alternatively, by opening the appropriate switches, for example contactors, in the electrical energy storage device 10, the total current flow can be completely interrupted in order not to continue to load the third electrical energy storage unit 109.

Alternatively, in the second step S12 the differential total current $dI_{pack}$ can be determined using formula (3) from the sum of the individual differential cell currents. Thus, if applicable, a measurement of the total current to determine $I_{pack}$ can be omitted.

An alternative to the determination of the factor $k_3$ from the respective conductances $G_1$ to $G_3$ is possible in the second step S12 using formula (4). Thus, where applicable, a determination of the individual conductances $G_1$, $G_2$, $G_3$ may be omitted. This can prove advantageous for the computation time and the memory requirements of the disclosed method.

Figure 3:
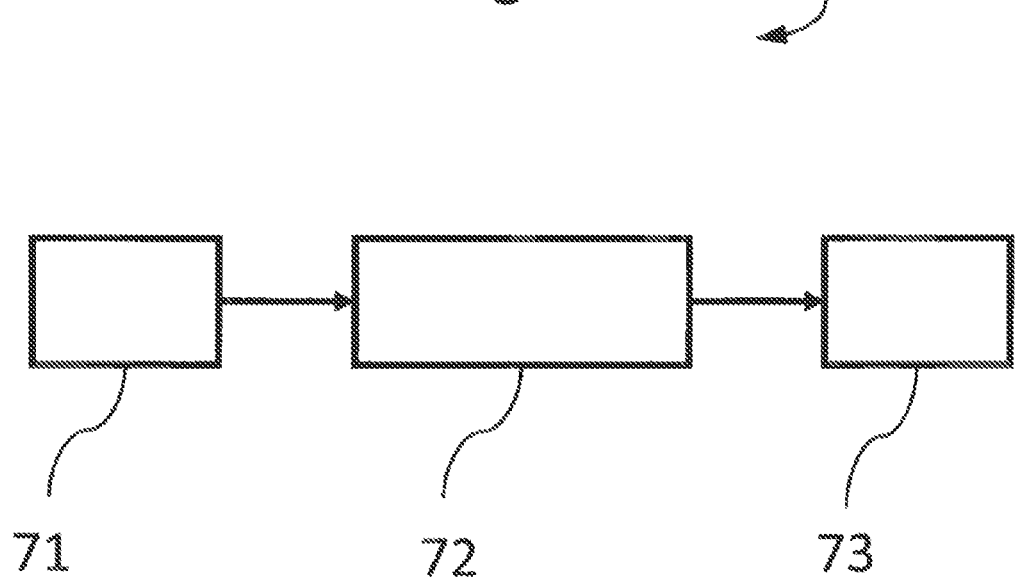
FIG. 3 a schematic representation of the disclosed device for detecting an internal short circuit.

FIG. 3 shows a schematic representation of the disclosed device 70, which is configured to implement the disclosed method for the detection of an internal short circuit in a first electrical energy storage unit of an electrical energy storage device. Using suitable sensors 71, for example, current and voltage sensors in an arrangement as shown in FIG. 1, electric currents and voltages are recorded and transmitted to a battery management controller 72. The battery management controller 72 then carries out the determination of the short-circuit current in the first electrical energy storage unit. If it detects an internal short-circuit, the battery management controller 72 controls a power electronics 73, for example an inverter, accordingly to reduce or interrupt a total current flow in the electrical energy storage device. This avoids a safety-critical situation which would result from further electrical loading of the first electrical energy storage unit.

The invention claimed is:

1. A method for detecting an internal short circuit in a first electrical energy storage unit (107, 108, 109) of an electrical energy storage device (10) comprising at least two electrical energy storage units (107, 108, 109) including a first electrical energy storage unit (107, 108, 109) and a second electrical energy storage unit (107, 108, 109) electrically connected in parallel in the electrical energy storage device (10), the method comprising:
    recording an electric current flowing into or out of the first electrical energy storage unit (107, 108, 109) and recording an electric current flowing into or out of the second electrical energy storage unit (107, 108, 109);
    determining differential current values for the first electrical energy storage and differential current values for the second electrical energy storage;
    determining an electrical short-circuit current in the first electrical energy storage unit (107, 108, 109) based on the determined differential current values for the first electrical energy storage and the determined differential current values for the second electrical energy storage; and
    detecting an internal short circuit when the magnitude of the determined electrical short-circuit current exceeds a predefined short-circuit current threshold.

2. The method according to claim 1, further comprising:
    determining an internal resistance ratio of the at least two electrical energy storage units (107, 108, 109), wherein determining the electrical short-circuit current is based on the determined internal resistance ratio.

3. The method according to claim 2, wherein the internal resistance ratio is determined using the determined differential current values of the first electrical energy storage unit and the determined differential current values of the second electrical energy storage unit.

4. The method according to claim 1, further comprising:
determining internal resistances of the at least two electrical energy storage units (107, 108, 109), wherein determining the electrical short-circuit current is based on the determined internal resistances of the at least two electrical energy storage units (107, 108, 109).

5. The method according to claim 1, wherein the electrical short-circuit current is determined via a summation over a predefined number of differential current values.

6. The method according to claim 1, wherein a battery management controller reduces a maximum permissible total current when the internal short circuit is detected.

7. The method according to claim 1, wherein a battery management controller reduces a permissible average total current when the internal short is detected.

8. The method according to claim 6, wherein the reduced permissible total current allows a vehicle to be driven at a reduce operating level.

9. The method according to claim 1, wherein a battery management controller opens a switch in the electrical energy storage device to completely interrupt a total current flow.

10. The method according to claim 9, wherein the completely interrupted total current flow stops the load on a third electrical energy storage unit.

11. A device (70) for detecting an internal short circuit in a first electrical energy storage unit (107, 108, 109) of an electrical energy storage device 10, comprising an electronic battery management controller (72) configured to carry out the steps of the method according to claim 1.

12. An electrical energy storage device (10), comprising at least two electrical energy storage units (107, 108, 109) and the device (70) of to claim 6.

13. A non-transitory computer-readable medium storing instructions that, when executed by a processor of a computer, cause the computer to perform the method of claim 1.

* * * * *